(12) United States Patent
Schutzmann

(10) Patent No.: US 10,002,267 B2
(45) Date of Patent: Jun. 19, 2018

(54) METHOD AND APPARATUS FOR CHECKING VALUE DOCUMENTS

(71) Applicant: GIESECKE & DEVRIENT GMBH, Munich (DE)

(72) Inventor: Jurgen Schutzmann, Pfaffenhofen (DE)

(73) Assignee: GIESECKE+DEVRIENT CURRENCY TECHNOLOGY GMBH, Munich (DE)

( * ) Notice: Subject to any disclaimer, the term of this patent is extended or adjusted under 35 U.S.C. 154(b) by 209 days.

(21) Appl. No.: 14/363,865

(22) PCT Filed: Dec. 6, 2012

(86) PCT No.: PCT/EP2012/005035
§ 371 (c)(1),
(2) Date: Jun. 9, 2014

(87) PCT Pub. No.: WO2013/087168
PCT Pub. Date: Jun. 20, 2013

(65) Prior Publication Data
US 2014/0367469 A1 Dec. 18, 2014

(30) Foreign Application Priority Data
Dec. 13, 2011 (DE) .................. 10 2011 120 972

(51) Int. Cl.
*G06K 7/08* (2006.01)
*G06K 19/06* (2006.01)
(Continued)

(52) U.S. Cl.
CPC ........... *G06K 7/087* (2013.01); *G01R 35/005* (2013.01); *G06K 7/08* (2013.01); *G06K 19/06* (2013.01); *G07D 7/04* (2013.01)

(58) Field of Classification Search
CPC ....................................................... G07D 7/04
See application file for complete search history.

(56) References Cited

U.S. PATENT DOCUMENTS 3,796,859 A * 3/1974 Thompson ............... G06K 7/08
360/327.23
3,873,975 A * 3/1975 Miklos ..................... G06K 7/08
235/449
(Continued)

FOREIGN PATENT DOCUMENTS

CN 2831269 Y 10/2006
CN 1959745 A 5/2007
(Continued)

OTHER PUBLICATIONS

German Search Report in corresponding Application No. DE10-2011-120-972 dated Jul. 19, 2012.
(Continued)

*Primary Examiner* — Daniel Walsh
(74) *Attorney, Agent, or Firm* — Workman Nydegger

(57) ABSTRACT

A method for checking value documents includes checking a security element having a plurality of magnetic regions, including a high-coercivity magnetic region, optionally a low-coercivity magnetic region and optionally a combined magnetic region which contains the high-coercivity as well as the low-coercivity magnetic material, and optionally a soft-magnetic magnetic region. After the magnetization of all the magnetic regions in a first direction, first magnetic signals of the security element are detected with a first magnetic detector. Subsequently, a second magnetization is performed wherein the low-coercivity magnetic material is remagnetized anti-parallel to the first magnetization, but the high-coercivity magnetic material remains aligned in the first magnetization direction. Second magnetic signals are detected with a second magnetic detector. On the basis of the (Continued)

magnetic signals, a magnetic region of the security element is identified as a high-coercivity, a low-coercivity, a combined or a soft-magnetic magnetic region.

16 Claims, 5 Drawing Sheets

(51) Int. Cl.
  *G01R 35/00* (2006.01)
  *G07D 7/04* (2016.01)

(56) References Cited

U.S. PATENT DOCUMENTS

| | | | |
|---|---|---|---|
| 5,196,681 A * | 3/1993 | Mantegazza | 235/449 |
| 5,418,458 A * | 5/1995 | Jeffers | 324/235 |
| 5,448,515 A * | 9/1995 | Fukami | G11C 11/15 365/171 |
| 5,545,885 A * | 8/1996 | Jagielinski | 235/449 |
| 5,583,333 A * | 12/1996 | Hoshino et al. | 235/493 |
| 6,202,926 B1 * | 3/2001 | Ito | G06K 19/06196 235/380 |
| 6,229,306 B1 | 5/2001 | Stein et al. | |
| 8,121,386 B2 | 2/2012 | Rancien | |
| 8,365,999 B2 * | 2/2013 | Lazzerini | B42D 25/355 235/379 |
| 8,387,879 B2 | 3/2013 | Schutzmann et al. | |
| 8,544,630 B2 * | 10/2013 | Schutzmann | G07D 7/04 194/214 |
| 8,544,893 B2 | 10/2013 | Schutzmann et al. | |
| 8,584,948 B2 * | 11/2013 | Lazzerini | G06K 19/06196 235/379 |
| 8,622,389 B2 * | 1/2014 | Schutzmann et al. | 271/262 |
| 8,910,869 B2 * | 12/2014 | Schutzmann et al. | 235/450 |
| 8,960,544 B2 * | 2/2015 | Lazzerini | G07D 7/04 235/435 |
| 9,183,421 B2 * | 11/2015 | Paul | G07D 7/04 |
| 9,336,640 B2 * | 5/2016 | Schutzmann | G07D 7/04 |
| 9,703,994 B2 * | 7/2017 | Paul | G06K 7/087 |
| 9,911,074 B2 * | 3/2018 | Rahm | G06K 19/06196 |
| 2001/0024743 A1 * | 9/2001 | Kanbe | C23C 14/185 428/811.2 |
| 2005/0157434 A1 * | 7/2005 | Ito | G11B 5/3906 360/324.2 |
| 2005/0242956 A1 * | 11/2005 | Sorkine | 340/572.6 |
| 2006/0078186 A1 * | 4/2006 | Freeman | G07D 7/04 382/135 |
| 2008/0316801 A1 * | 12/2008 | Jedema | G11C 11/1673 365/158 |
| 2009/0008922 A1 * | 1/2009 | Schutzmann | G06K 19/12 283/67 |
| 2010/0052307 A1 * | 3/2010 | Schutzmann | G07D 7/004 283/67 |
| 2010/0188306 A1 * | 7/2010 | Kitayoshi et al. | 343/767 |
| 2010/0219245 A1 * | 9/2010 | Schutzmann | G06K 19/06187 235/449 |
| 2010/0327061 A1 * | 12/2010 | Lazzerini | G07D 7/04 235/449 |
| 2010/0327062 A1 * | 12/2010 | Lazzerini | B42D 25/355 235/450 |
| 2011/0233277 A1 * | 9/2011 | Schutzmann | G01R 33/091 235/450 |
| 2012/0018513 A1 * | 1/2012 | Lazzerini | G06K 19/06196 235/440 |
| 2012/0160632 A1 * | 6/2012 | Schutzmann | G07D 7/04 194/302 |
| 2012/0163696 A1 * | 6/2012 | Ross | G01R 33/04 382/135 |
| 2013/0082105 A1 * | 4/2013 | Schutzmann | G07D 7/04 235/450 |
| 2013/0087616 A1 * | 4/2013 | Lazzerini | G06K 19/06187 235/449 |
| 2013/0229895 A1 * | 9/2013 | Shiroishi | G11B 5/1278 369/13.14 |
| 2014/0191035 A1 * | 7/2014 | Paul | G07D 7/04 235/450 |
| 2014/0312894 A1 * | 10/2014 | Bartos | G07D 7/04 324/252 |
| 2014/0367469 A1 * | 12/2014 | Schutzmann | G07D 7/04 235/450 |
| 2015/0160326 A1 * | 6/2015 | Schutzmann | G07D 7/04 324/202 |
| 2015/0302676 A1 * | 10/2015 | Mengel | G07D 7/04 382/135 |
| 2016/0042265 A1 * | 2/2016 | Rahm | G07D 7/04 235/449 |
| 2016/0055358 A1 * | 2/2016 | Paul | G07D 7/04 235/450 |
| 2016/0071350 A1 * | 3/2016 | Ueyama | G01N 27/72 324/228 |
| 2016/0275744 A1 * | 9/2016 | Ueyama | G01N 27/72 |
| 2017/0003358 A1 * | 1/2017 | Ueyama | G01R 33/12 |

FOREIGN PATENT DOCUMENTS

| | | | |
|---|---|---|---|
| CN | 101305130 A | 11/2008 | |
| CN | 102272613 A | 12/2011 | |
| DE | 102004049999 A1 | 4/2006 | |
| DE | 102008061507 A1 | 6/2010 | |
| DE | 102009039588 A1 | 3/2011 | |
| EP | 0428779 A1 | 5/1991 | |
| GB | 2 130 414 A | 5/1984 | |
| WO | WO 2009103352 A1 * | 8/2009 | G07D 7/04 |

OTHER PUBLICATIONS

International Preliminary Report on Patentability for International PCT Application No. PCT/EP2012/005035, dated Jun. 17, 2014.
International Search Report for Corresponding International PCT Application No. PCT/EP2012/005035, dated Apr. 4, 2013.
Chinese Search Report from Chinese Application No. 2012800599534, dated Aug. 21, 2015.

* cited by examiner

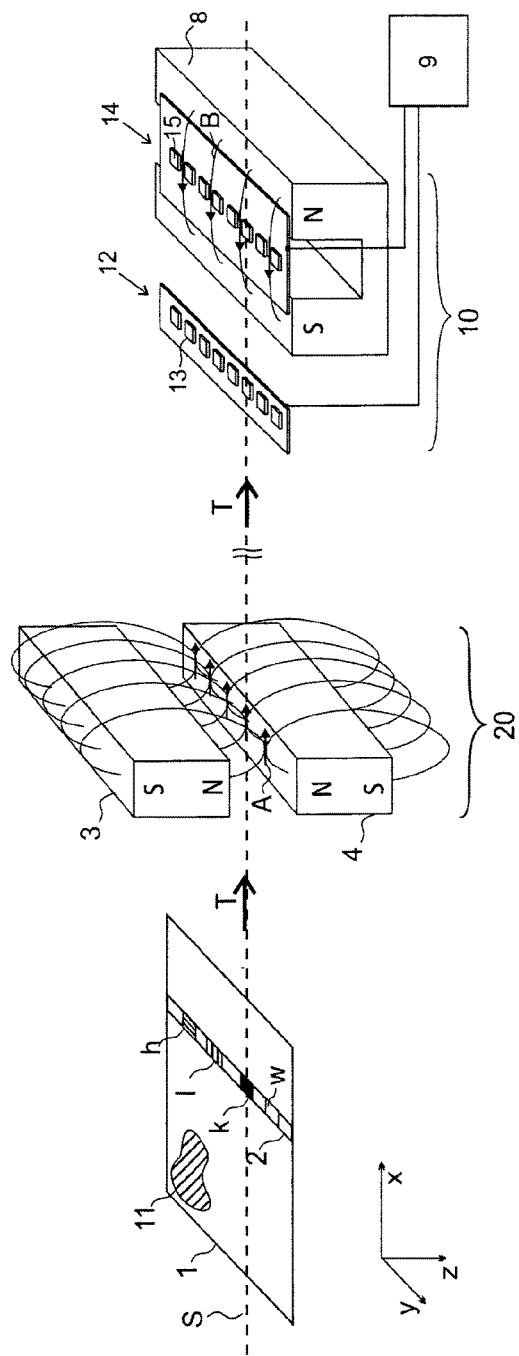
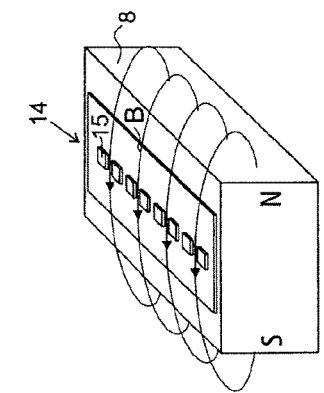
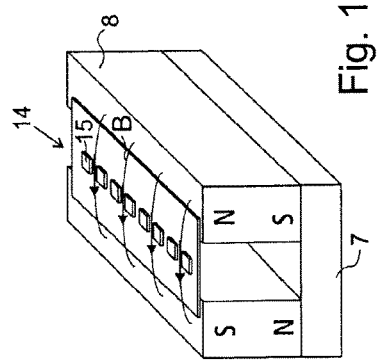
Fig. 1a
Fig. 1b
Fig. 1c

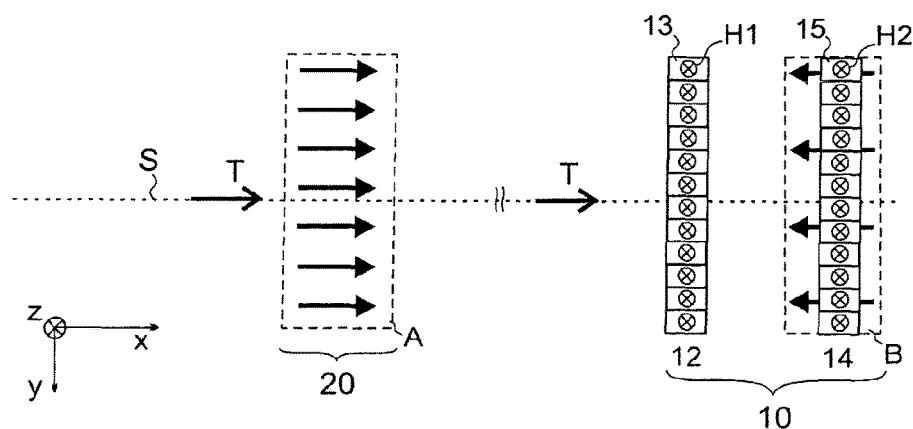
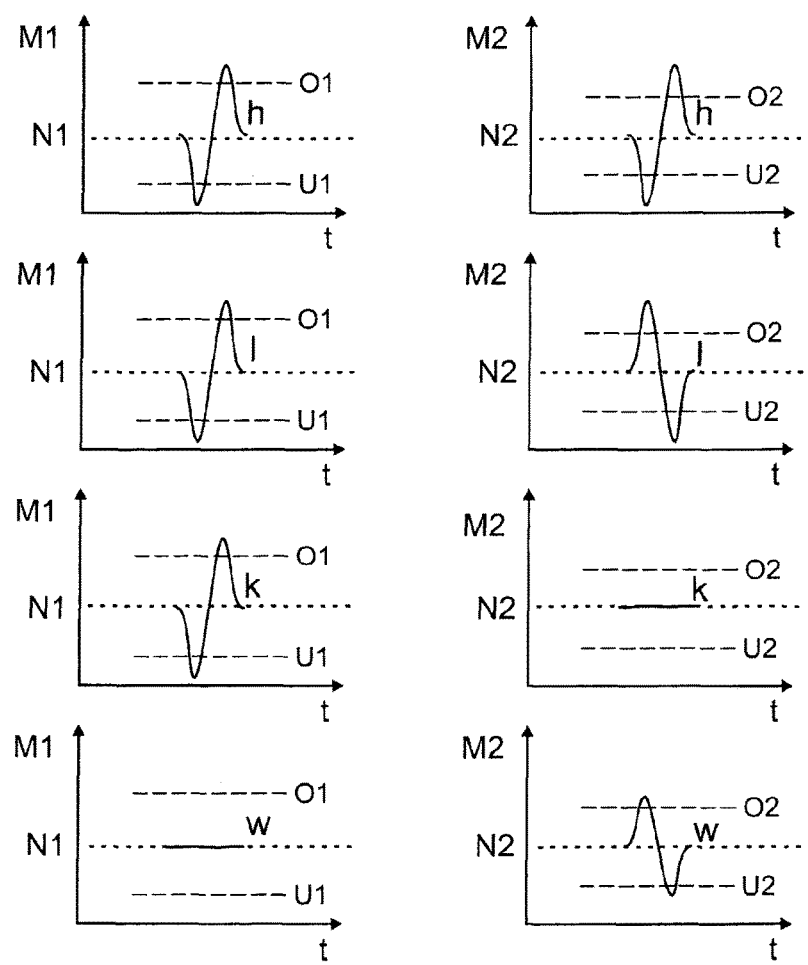
Fig. 3a
Fig. 3b

METHOD AND APPARATUS FOR CHECKING VALUE DOCUMENTS

BACKGROUND

This invention relates to a method and an apparatus for checking value documents, such as e.g. bank notes, checks, cards, tickets, coupons.

From the prior art it is known to equip value documents with security elements, such as security strips or also security threads, which contain magnetic material. The magnetic material can be applied to the security element either continuously or only in some regions, for example in the form of a coding. For magnetically coding a security element there is used for example a certain sequence of magnetic and non-magnetic regions that is characteristic of the value document. Moreover, it is known to employ different magnetic materials for a magnetic coding, e.g. with different coercive field strengths. For example, there are used two different-coercitivity magnetic materials from which two sorts of magnetic regions are formed which are disposed on the security element.

Further, it is known to machine check bank notes having security threads which have a magnetic coding consisting of different-coercitivity materials. The bank notes are transported parallel to the longitudinal direction of the security element, successively first passing through a strong magnetic field parallel to the transport direction, which magnetizes the high— as well as the low-coercivity magnetic regions along the transport direction. The remaining magnetization is checked by means of an inductive magnetic detector which is sensitive parallel to the transport direction. Subsequently, the bank notes pass through a weaker magnetic field perpendicular to the transport direction, which aligns only the low-coercivity magnetic regions perpendicular to the transport direction, while the high-coercivity magnetic regions remain magnetized in the transport direction. Again, the remaining magnetization is checked by means of an inductive magnetic detector which is sensitive parallel to the transport direction. The first inductive magnetic detector thereby detects the high- and the low-coercivity magnetic regions, and the second inductive magnetic detector detects only the high-coercivity magnetic regions. However, if the security element also contains combined magnetic regions containing both different-coercitivity magnetic materials, so that the different-coercitivity magnetic materials pass into the detection region of the magnetic detector at the same time, a superimposition of the magnetic signals of the different-coercitivity magnetic materials is detected. The combined magnetic regions thereby deliver a reduced magnetic signal whose signal swing lies between that of the high-coercivity and that of the low-coercivity magnetic regions. It is disadvantageous in this method that these combined magnetic regions are difficult to distinguish from the high-coercivity and from the low-coercivity magnetic regions. Furthermore, it is disadvantageous to employ, for remagnetizing the low-coercivity magnetic regions, a magnetic field that is oriented parallel to the transport plane and perpendicular to the transport direction of the value document. For, using conventional magnets, thus oriented magnetic fields can only be realized with relatively low magnetic field strength.

SUMMARY

The invention is hence based on the object of carrying out the check of the value documents such that the different magnetic regions of a security element can be respectively distinguished from each other reliably.

The value document to be checked has a security element having a plurality of magnetic regions. The magnetic regions include at least one high-coercivity magnetic region made of a high-coercivity magnetic material having a first coercive field strength, optionally at least one low-coercivity magnetic region made of a low-coercivity magnetic material having a second coercive field strength which is lower than the first coercive field strength, and optionally at least one combined magnetic region having the high-coercivity as well as the low-coercivity magnetic material. The high-coercivity and low-coercivity magnetic materials of the combined magnetic region are e.g. disposed one on the other or contained therein in the form of a mixture. Further, the security element can also have one or more soft-magnetic magnetic regions.

Preferably, the at least one combined magnetic region is so configured that the high-coercivity magnetic material of the combined magnetic region and the low-coercivity magnetic material of the combined magnetic region have substantially the same remanent flux density. The combined magnetic region contains in particular the same quantity of the high-coercivity and of the low-coercivity magnetic material. However, the high- and low-coercivity portions of the at least one combined magnetic region can also deviate from each other, e.g. due to unavoidable print tolerances during the manufacture of the magnetic regions. Preferably, the remanent flux densities of the high-coercivity magnetic region and of the low-coercivity magnetic region are also equal. For example, the remanent flux density of the high-coercivity magnetic material of the combined magnetic region amounts to half the remanent flux density of the high-coercivity magnetic region. And the remanent flux density of the low-coercivity magnetic material of the combined magnetic region amounts to half the remanent flux density of the low-coercivity magnetic region. The at least one combined magnetic region can have a resultant remanent flux density which is equal to the remanent flux density of the high-coercivity magnetic region and/or equal to the remanent flux density of the low-coercivity magnetic region. Alternatively, the remanent flux densities of the high-coercivity, of the low-coercivity and of the combined magnetic regions can also be different, however.

For checking the value document, the following steps are carried out. The value document, or the security element of the value document, is magnetized by a first magnetic field whose magnetic field strength is greater than the first and than the second coercive field strength. The magnetization of the high-coercivity magnetic material (of the high-coercivity as well as of the combined magnetic region) and the magnetization of the low-coercivity magnetic material (of the low-coercivity as well as of the combined magnetic region) are thereby aligned uniformly in a first magnetization direction. The first magnetization direction is oriented for example parallel or anti-parallel to the transport direction of the value document. However, it can also be oriented differently, e.g. obliquely to the transport direction of the value document or perpendicular to the transport plane of the value document. During the first magnetizing, no magnetic signal is detected. After the first magnetizing, first magnetic signals of the security element are detected by a first magnetic detector. The first magnetizing leads to the high-coercivity, the low-coercivity and the combined magnetic regions respectively producing a clear first magnetic signal. A soft-magnetic magnetic region shows only a vanishingly low first magnetic signal, in contrast.

Subsequently, the value document, or the security element, is magnetized by a second magnetic field whose magnetic field strength is smaller than the first coercive field strength, but greater than the second coercive field strength. The magnetic field strength of the first magnetic field is greater than the magnetic field strength of the second magnetic field by at least a factor of two, preferably by at least a factor of three. The second magnetic field is so oriented that the magnetization of the low-coercivity magnetic material (of the low-coercivity as well as of the combined magnetic region) is aligned anti-parallel to the first magnetization direction. The magnetization of the high-coercivity magnetic material (of the high-coercivity as well as of the combined magnetic region) remains aligned in the first magnetization direction unchanged upon the second magnetization. Under the action of the second magnetic field which is oriented anti-parallel to the first magnetic field, second magnetic signals of the security element are detected by a second magnetic detector. That is to say, the magnetic region whose second magnetic signal is detected is located in the second magnetic field during the detection of its second magnetic signals. The second magnetic field is configured such that, upon the check of the value document, said field acts on a security-element section to be detected, after the detecting of the first magnetic signal of the respective section and during the detecting of the second magnetic signal of the respective section. The second magnetic field is in particular configured such that it acts on the security element not only during, but also already before the detecting of the second magnetic signals. Through the second magnetic field, the magnetization of the low-coercivity magnetic material is changed before the second magnetic signals are detected.

The high-coercivity as well as the low-coercivity magnetic material of the security element is magnetized in the first magnetization direction immediately before and during the detecting of its first magnetic signals. The security element is thus, after the first magnetizing by the first magnetic field and before the detecting of the first magnetic signals, not magnetized by a further magnetic field whose magnetic field strength is smaller than the first coercive field strength and whose direction differs from that of the first magnetic field. The first magnetic signals of the security element are not detected under the action of the first magnetic field and not under the action of the second magnetic field.

The first and the second magnetic signals are e.g. analyzed in order to identify at least one magnetic region of the security element as one of the high-coercivity or of the low-coercivity or of the combined magnetic regions or of the soft-magnetic magnetic regions. The invention enables both a distinction of the high-coercivity, of the low-coercivity and of the combined magnetic regions and moreover allows soft-magnetic magnetic regions of the security element to be distinguished therefrom. No additional magnetic detector is thus required for their recognition. Only two magnetic detectors are thus required for unambiguously distinguishing from each other these four possible sorts of magnetic regions which can have security elements to be checked.

Since the magnetic field strength of the second magnetic field is lower than the first coercive field strength, the high-coercivity magnetic material is not remagnetized by the second magnetic field. The magnetization of the low-coercivity magnetic material, however, is aligned anti-parallel to the first magnetization direction by the second magnetic field. Hence, the second magnetic signal of the at least one low-coercivity magnetic region differs from its first magnetic signal. For example, the second magnetic signal of the low-coercivity magnetic region is substantially inverted in comparison to its first magnetic signal.

Moreover, the anti-parallel magnetization of the low-coercivity magnetic material also leads to the second magnetic signal of the at least one combined magnetic region respectively differing from the second magnetic signals of the high- and low-coercivity magnetic regions. The at least one combined magnetic region is so magnetized by the second magnetic field that a resultant magnetization of the at least one combined magnetic region, which arises through the second magnetizing, vanishes at least approximately. For this purpose, the combined magnetic regions are preferably so configured that the low-coercivity magnetic material of the combined magnetic region and the high-coercivity magnetic material of the combined magnetic region have at least approximately the same remanent flux density. When, in this case, the low-coercivity magnetic material of the combined magnetic region is magnetized anti-parallel to the high-coercivity magnetic material of the combined magnetic region by the second magnetic field, a vanishing resultant magnetization of the respective combined magnetic region is ideally obtained. Because the resultant magnetization of the combined magnetic regions nearly vanishes, it is possible to distinguish the second magnetic signals of the combined magnetic regions very reliably from the second magnetic signals of the other magnetic regions. When a clear first magnetic signal is detected, a high-coercivity or a low-coercivity or a combined magnetic region is present. On the basis of the second magnetic signal of the respective magnetic region it can then be decided whether the respective magnetic region is a high-coercivity, a low-coercivity or a combined magnetic region. Those sections of the security element from which a clear first magnetic signal is detected but from which the second magnetic detector detects a near-vanishing second magnetic signal are identified as combined magnetic regions.

The exact form of the magnetic signal of the individual magnetic regions depends on the kind of magnetic detectors employed as well as on the remanent flux density and on the length of the respective magnetic region. For example, the magnetic signals of the high-coercivity, of the low-coercivity and of the combined magnetic regions can respectively be configured as a simple peak or as a double peak. In the case of vanishing resultant magnetization, as is produced by the anti-parallel second magnetizing in the case of the combined magnetic regions, the second magnetic signal of the combined magnetic region has no pronounced peaks and corresponds roughly to a second signal offset of the second magnetic signal.

The high-coercivity and the low-coercivity magnetic regions respectively produce clear first and clear second magnetic signals and can be distinguished from each other by their signal form and/or using one or more threshold comparisons or by means of other methods. Since the magnetic signals of the high- and low-coercivity magnetic regions can be configured differently, depending on the kind of magnetic detector employed, the decision of whether a magnetic region is identified as a high-coercivity or as a low-coercivity magnetic region also depends on the kind of magnetic detector. With some magnetic detectors, the second magnetic signal of a high-coercivity magnetic region is configured as a positive simple peak, and the second magnetic signal of a low-coercivity magnetic region as a negative simple peak. In this case, every magnetic region whose second magnetic signal exceeds the upper threshold can be identified as a high-coercivity magnetic region, and every magnetic region whose second magnetic signal undershoots the lower threshold as a low-coercivity magnetic region. With other magnetic detectors, the second magnetic signal of the high-coercivity and of the low-coercivity magnetic regions is respectively configured as a double peak, the double peak of the low-coercivity magnetic region being configured inversely to the double peak of the high-coercivity magnetic region. For distinguishing the high-coercivity from the low-coercivity magnetic regions, one can e.g. analyze the signal form of the second magnetic signals.

For checking the security element, there can be carried out an evaluation of the first and second magnetic signals that employs two thresholds with which the respective first magnetic signal and second magnetic signal of the respective magnetic region are compared. The first magnetic signal is compared with a first upper threshold and with a first lower threshold which lies below the first upper threshold. The second magnetic signal is compared with a second upper threshold and with a second lower threshold which lies below the second upper threshold. The first upper threshold lies above, and the first lower threshold lies below, a signal offset of the first magnetic signal. The second upper threshold lies above, and the second lower threshold lies below, a signal offset of the second magnetic signal. Because the second upper threshold and the second lower threshold are disposed on mutually opposing sides of the first signal offset, the comparing of the second magnetic signal with these two thresholds leads to a very reliable distinction of the combined magnetic regions from the high- and low-coercivity magnetic regions. To further optimize the identification of the combined magnetic regions, the second upper threshold and second lower threshold are preferably so defined that the two thresholds have a relatively large distance apart. The distance amounts e.g. to at least 50%, preferably at least 75%, of an average signal swing that the second magnetic signal of the high-coercivity and/or of the low-coercivity magnetic regions has relative to the signal offset of the second magnetic signal.

The upper threshold and/or the lower threshold can be chosen in dependence on the first and/or second magnetic signal of the security element, e.g. in dependence on a signal swing of the first and/or second magnetic signal that the first or second magnetic signal has relative to its signal offset. It is thus possible to react, virtually automatically, e.g. to transport fluctuations of the value document or to manufacturing-based fluctuations of the quantity of magnetic material in the magnetic regions. The upper threshold and/or the lower threshold can be chosen to be the same for all magnetic regions, so that all first or second magnetic signals of the magnetic regions are compared with the same upper threshold and with the same lower threshold. It can be chosen dynamically in dependence on the first or second magnetic signal. When the signal swing of the first or second magnetic signals of the magnetic regions of the security element is for example relatively high or low on average, the upper threshold is also increased or reduced accordingly.

For evaluating the magnetic signals the comparison with thresholds can, however, also be done with values derived from the respective first magnetic signal and/or values derived from the respective second magnetic signal. The derived value can be the maximum value of the first or of the second magnetic signal which the first or second magnetic detector or its individual magnetosensitive elements detect at the respective position along the longitudinal direction of the security element. The derived value can also be the area under the first or second magnetic signal at the respective position along the security element, or other characteristics of the first or second magnetic signal, or characteristics of values derived from the first magnetic signal and second magnetic signal. For checking the security element there can, however, also be employed values that have been derived from both, i.e. from the first magnetic signal and second magnetic signal.

When identifying the magnetic regions, a magnetic region whose first magnetic signal or values derived therefrom exceed a first upper threshold and/or undershoot a first lower threshold, and whose second magnetic signal or values derived therefrom neither exceed a second upper threshold nor undershoot a second lower threshold, is identified as a combined magnetic region. A magnetic region whose first magnetic signal or values derived therefrom exceed the first upper threshold and/or undershoot the first lower threshold, and whose second magnetic signal or values derived therefrom exceed the second upper threshold and/or undershoot the second lower threshold, is identified either as a high-coercivity or as a low-coercivity magnetic region. And a magnetic region whose first magnetic signal or values derived therefrom neither exceed a first upper threshold nor undershoot a first lower threshold, and whose second magnetic signal or values derived therefrom exceed a second upper threshold and/or undershoot a second lower threshold, is identified as a soft-magnetic magnetic region.

The values derived from the detected first or second magnetic signal can also be correlation values which are formed by correlating the first or second magnetic signal with a base signal that is characteristic of the first or second magnetic detector, or of its individual magnetosensitive elements. For one magnetic region there can be derived one or more correlation values. A correlation value derived from the first or second magnetic signal is e.g. the maximum value of a correlation curve which is respectively determined for a position along the longitudinal direction of the security element. However, other characteristics of the correlation curve can also be employed.

In particular, there is carried out an evaluation of the magnetic signals of the security element that respectively employs for a plurality of magnetic regions of the security element individually at least one correlation value derived from the first magnetic signal of the respective magnetic region. The correlation value is formed by a correlation of the respective first magnetic signal with a first base signal that is characteristic of the first magnetic detector. Alternatively or additionally, there can respectively be employed for a plurality of magnetic regions of the security element individually at least one correlation value derived from the second magnetic signal of the respective magnetic region, said correlation value being formed by a correlation of the respective second magnetic signal with a second base signal that is characteristic of the second magnetic detector.

In comparison to a direct evaluation of the detected magnetic signals themselves, the evaluation of the correlation values obtained by correlation with the base signal is advantageous since, in this case, all detected single measurement values of the first or second magnetic signal of a magnetic region enter into the evaluation, i.e. the total magnetic signal of the respective magnetic region is respectively rated. By contrast, in the case of a simple threshold comparison of the detected magnetic signal, only few single measurement values contribute, e.g. those exceeding a threshold. The correlation with the base signal hence allows a substantially more robust evaluation of the detected magnetic signals, which is less susceptible to disturbances than a direct evaluation of the detected magnetic signals.

It has been found that it is advantageous to choose the first and/or second base signal in dependence on the properties of the magnetic region or of the security element, e.g. in dependence on its extension in the transport direction. For example, it is advantageous to employ different base signals for security threads of different width. Preferably, a dynamically produced base signal is employed. In particular, the first base signal is established from the first magnetic signal, and/or the second base signal from the second magnetic signal, of one or more magnetic regions of the security element dynamically, i.e. during the check of the respective security element. Preferably, the first base signal and/or the second base signal are thereby established individually for each security element. For example, the base signal can be formed dynamically by averaging the detected first and/or second magnetic signals. A dynamically produced base signal is advantageous since this allows a flexible and reliable value-document check. For in this manner the above-described correlation values can be formed on-line and employed for checking the security element even for strange value documents for which no base signal is known yet. Correlation with a dynamically produced base signal also enables account to be taken of fluctuations of the magnetic-signal detection and of manufacturing-based fluctuations of the value-document quality, and the state of the value documents.

For checking the security element, the respective derived correlation values can then be compared with an upper threshold and a lower threshold, and the magnetic regions be identified in dependence on the exceeding or undershooting of the two thresholds. The length of the individual magnetic regions along the longitudinal direction of the security element can be determined e.g. from the pattern of the first magnetic signals and/or of the second magnetic signals along the longitudinal direction of the security element or from the pattern of the derived values, in particular of the derived correlation values.

Instead of a threshold comparison, a further correlation calculation can also be carried out for evaluating the derived values. For example, there can be carried out an evaluation of the first magnetic signals wherein the correlation values derived from the first magnetic signal by the correlation with the first base signal, as a function of the longitudinal direction of the security element, are correlated with at least one predetermined reference pattern as a function of the longitudinal direction of the security element. Alternatively or additionally, the evaluation can also comprise correlating the correlation values derived from the second magnetic signal by the correlation with the second base signal, as a function of the longitudinal direction of the security element, with at least one predetermined reference pattern as a function of the longitudinal direction of the security element. For example, the evaluation device has stored therein information items on the first reference pattern and the second reference pattern which are respectively associated with the different security elements. The results of these further correlations of the first correlation values and/or of the second correlation values with the respective reference pattern can be employed for checking the security element.

Optionally, the value document also has one or more soft-magnetic magnetic regions, whose second magnetic signal is detected under the action of the second magnetic field on the respective soft-magnetic region. The soft-magnetic magnetic regions can be part of a coding of the security element or be disposed on the value document outside the security element. For detecting the soft-magnetic magnetic regions located outside the security element, at least the second magnetic signals of the value document are also detected outside the security element. Since the second magnetic field magnetizes the respective soft-magnetic region during the detection of the second magnetic signals, the soft-magnetic magnetic material produces a clear second magnetic signal. The soft-magnetic regions of the security element can be identified as soft-magnetic regions by their second magnetic signal and by their vanishing first magnetic signal. For checking the value document, one or more regions of the value document can be tested for their magnetic properties in a locally resolved manner.

The invention also relates to an apparatus for checking a value document having a security element which has at least one of the above-mentioned high-coercivity and/or low-coercivity and/or combined and/or soft-magnetic magnetic regions. Using this apparatus it is also possible to reliably verify a magnetic coding of the security element made of high-coercivity, low-coercivity, combined and soft-magnetic magnetic regions. The apparatus according to the invention can be configured as a sensor for checking value documents or as a value-document processing apparatus to which value documents can be inputted for their check, or as an assembly that is intended to be installed in such an apparatus.

The apparatus has a first magnetization device for making available the first magnetic field which is configured for the first magnetizing of the high-coercivity and the low-coercivity magnetic material of the security element in a first magnetization direction. In the magnetic field of the first magnetization device, no magnetic detector is located. Moreover, the apparatus has a second magnetization device for making available the second magnetic field which is configured for the second magnetizing of the low-coercivity magnetic material of the security element in a second magnetization direction which is oriented anti-parallel to the first magnetization direction.

In the value-document processing apparatus, the first magnetization device is preferably disposed so as to be spatially separate from the two magnetic detectors and from the second magnetization device. Preferably, the first magnetization device and the first magnetic detector have a distance apart of at least 4 cm, preferably at least 12 cm, along the transport direction of the value document. This avoids magnetic disturbances of the detected magnetic signals that could otherwise occur through the large first magnetic field. Also, the first magnetization device can be disposed at the beginning of the value-document transport path, and the two magnetic detectors as well as the second magnetization device at a completely different place (after the first magnetization device) along the transport path. This spatial separation enables the assembly according to the invention to be used very flexibly and e.g. to be installed even in small value-document processing apparatuses having little room.

Moreover, the apparatus has a first magnetic detector for detecting first magnetic signals of the security element and a second magnetic detector for detecting second magnetic signals of the security element. The first magnetic detector is so disposed that, upon the check of the value document, for each section of the value document, the first magnetic signal is only detected after the first magnetizing and before the second magnetizing of the respective section has been carried out. The second magnetic field is configured such that, upon the check of the value document, said field acts on the security-element section to be detected after the detecting of the first magnetic signal of the respective section and during the detecting of the second magnetic signal of the respective section.

The second magnetization device preferably consists of one or more magnets, e.g. permanent magnets, disposed on one side of the transport path of the value document. This at least one magnet is disposed on the side of the transport path on which the second magnetic detector is also disposed. Opposing it, on the other side of the transport path, there is no further magnetic material present, in particular no further magnet. The second magnetic detector and the second magnetization device are preferably disposed on the same side of the transport plane, the second magnetic detector being disposed between the second magnetization device and the transport plane of the value document. Disposing the magnet and the second magnetic detector on the same side of the transport plane, or doing without further magnetic material on the side opposing the second magnetic detector, avoids magnetic-field fluctuations at the location of the second magnetic detector that could otherwise occur due to mechanical vibrations of the assembly. Preferably, the at least one magnet of the second magnetization device and the second magnetic detector are mechanically fixed to each other so as to form one constructional unit. For example, the second magnetic detector is for this purpose potted with the permanent magnet that produces the second magnetic field. However, a suitable fixation can also be obtained by bonding, screwing, etc. The mechanical fixation to each other achieves that the relative position between the permanent magnet and the second magnetic detector remains stable and mechanical vibrations cause no disturbances of the second magnetic signals.

Preferably, the second magnetic detector is disposed on the at least one magnet of the second magnetization device such that the distance between the surface of the at least one magnet facing the value document and the magnetosensitive elements of the second magnetic detector, along the direction perpendicular to the transport plane of the value document, amounts to at most 4 mm. Thus disposing the second magnetic detector as close as possible to the magnet surface has the advantage that the second magnetization device can be disposed very close to the transport plane of the value documents. Thus, it is possible to produce in a simple manner a sufficiently large second magnetic field in order to magnetize the value document being transported past. The magnetosensitive elements of the second magnetic detector are preferably disposed substantially in a symmetry plane of the second magnetization device, e.g. in the middle of the magnet, since there they are advantageously subjected to a defined magnetic field parallel or anti-parallel to the transport direction. A very exact positioning of the magnetosensitive elements of the second magnetic detector in the magnetic field of the second magnet can be obtained by fastening the magnetosensitive elements on a common carrier which is mechanically fixed in its optimal position to the second magnetization device.

The apparatus can further have an evaluation device for analyzing the first and second magnetic signals. The evaluation device is adapted for checking the security element for the presence of certain high-coercivity and/or low-coercivity and/or combined and/or soft-magnetic magnetic regions, as was explained hereinabove with reference to the method, e.g. in order to distinguish these magnetic regions from each other by their first and second magnetic signals. The evaluation device is adapted e.g. for verifying a magnetic coding of the security element, or for establishing at which positions on the security element magnetic regions of the security element are localized and for identifying these magnetic regions. The evaluation device can be a component of the apparatus. However, it can also be a device independent thereof to which the first and second magnetic signals are transferred.

The first magnetic detector and/or the second magnetic detector have e.g. a certain principal sensitivity direction which can be oriented parallel or anti-parallel to the first magnetization direction, or which can lie perpendicular to the first magnetization direction and perpendicular to the transport plane of the value document, or which can lie obliquely in the transport plane. The first magnetic detector and second magnetic detector preferably have the same principal sensitivity direction. With regard to the handling of the magnetic detectors, it is especially advantageous to employ two identically constructed magnetic detectors for the first and second magnetic detectors. In particular, the magnetosensitive elements of the second magnetic detector are disposed such that the second magnetic field is oriented as perpendicular as possible to the principal sensitivity direction of the magnetosensitive elements of the second magnetic detector. Since this keeps a magnetic bias of the second magnetic detector low, a greater dynamic range is attainable in some magnetic detectors. The first magnetic detector and second magnetic detector can be configured as sensor lines respectively having a multiplicity of magnetosensitive elements, but they can also be configured as individual magnetosensitive elements. The magnetosensitive elements of the magnetic detectors can be configured as magnetoresistive elements, e.g. as conventional magnetoresistive elements, GMR, AMR, SdT or spin-valve elements, but there can also be employed inductive elements, Hall elements, etc.

BRIEF DESCRIPTION OF THE DRAWINGS

Hereinafter the invention will be explained by way of example with reference to the following figures. There are shown:

FIG. 1a a first exemplary embodiment in a three-dimensional view,

FIGS. 1b, c two further examples of the second magnetization device,

DETAILED DESCRIPTION OF VARIOUS EMBODIMENTS

Figure 2A:
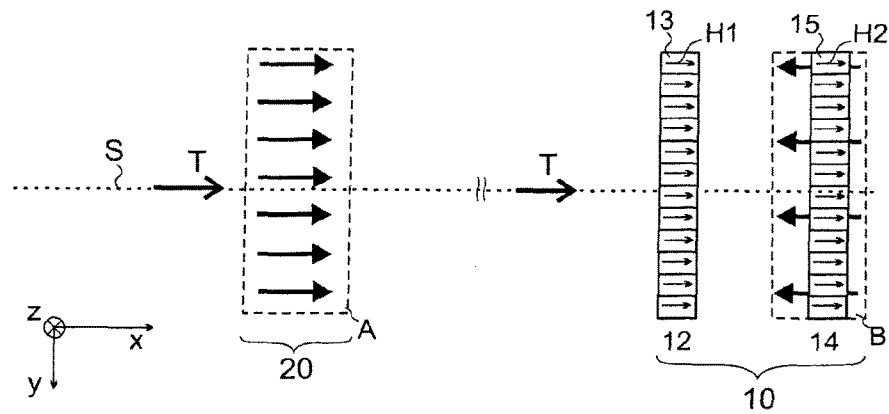
FIGS. 2a, b a further exemplary embodiment wherein the first magnetic detector and second magnetic detector are sensitive parallel to the transport direction of the value document (FIG. 2a) and, schematically, the appurtenant magnetic signals M1, M2 as a function of time t (FIG. 2b), FIGS. 3a-c a further exemplary embodiment wherein the first magnetic detector and second magnetic detector are sensitive perpendicular to the transport plane of the value document (FIG. 3a), schematically, the appurtenant magnetic signals M1, M2 as a function of time t (FIG. 3b), and the correlation values K2 obtained by correlating the magnetic signals M2 with a base signal B2, FIG. 4a a further exemplary embodiment with two magnetic detectors which are oriented perpendicular to the transport direction of the security element and perpendicular to the longitudinal direction of the security element, FIG. 4b a further exemplary embodiment with two magnetic detectors which are oriented obliquely to the transport direction of the security element and obliquely to the security element.

FIG. 1 shows a first exemplary embodiment of the apparatus according to the invention. The shown apparatus is contained in a value-document processing apparatus to which the value documents 1 are inputted individually or in stacks, subsequently checked, sorted and stored in the value-document processing apparatus or outputted again. A value document 1 is transported along a transport path S first past a magnetization device 20, for making available a magnetic field A, and thereafter past a magnetic sensor 10 with two sensor lines 12, 14. The magnetic field A is made available by two mutually opposing magnets 3, 4 between which the value document 1 is transported through. The poles N, S of the magnets 3, 4 are so aligned that there arises therebetween a magnetic field A parallel to the transport direction T. At the beginning of the assembly of the magnets 3, 4 there forms, with this magnet assembly, a magnetic field which can lead to a preceding, additional remagnetization of the security element, this having no influence, however, on the magnetization of the security element resulting after the magnetic field A. Alternatively, the first magnetization device 20 can also be disposed on only one side of the transport path S, as long as this achieves a sufficiently great magnetic field strength for magnetizing the high-coercivity magnetic material. For example, the first magnetic field A can also be made available by only one of the magnets 3 or 4, or by a horseshoe magnet analogous to magnet 8, cf. FIG. 1a, right, or by a magnet disposed analogously to FIG. 1c, or by a magnet assembly analogous to FIG. 1b.

The value document 1 has a security element 2 with a magnetic coding. The security element 2 is configured in this example as a security thread which contains along its longitudinal direction a first high-coercivity magnetic region h, a low-coercivity magnetic region l and optionally a combined magnetic region k and optionally a soft-magnetic magnetic region w. However, the invention is also suitable for other kinds of magnetic security elements of value documents. Between these magnetic regions h, l, k, w there is located non-magnetic material. The high-coercivity magnetic material and the low-coercivity magnetic material of the combined magnetic region k have roughly the same remanent flux density. The combined magnetic region k contains the two magnetic materials disposed one on the other or as a mixture. The soft-magnetic magnetic region w contains a soft-magnetic material different from these magnetic materials, its remanent flux density being very low.

The first magnetic field A is oriented parallel to the transport direction T of the value document 1 and has a great magnetic field strength which is greater than the coercive field strengths of all the magnetic materials of the security element 2. Through the first magnetic field A, the high-coercivity as well as the low-coercivity magnetic material is aligned in a first magnetization direction which is oriented, in this example, parallel to the transport direction T of the value document 1 (x direction). Therefore, the magnetic field A aligns the magnetization of the high-coercivity magnetic region h as well as that of the low-coercivity magnetic region l as well as that of the combined magnetic region k of the security element 2 in the x direction.

After the first magnetization the value document 1 is transported past the magnetic sensor 10 which is installed in the value-document processing apparatus so as to be spatially separate from the assembly 20. Therebetween there can be provided e.g. branches or deflections of the transport path S. The magnetic sensor 10 contains two sensor lines 12, 14 which respectively have a multiplicity of magnetosensitive elements 13, 15 of the same kind, which are disposed in a line. Each of these magnetosensitive elements 13, 15 delivers a magnetic signal, so that, in this example, a multiplicity of first magnetic signals M1 are detected using the magnetosensitive elements 13 and a multiplicity of second magnetic signals M2 using the magnetosensitive elements 15. Each element 13 of the first sensor line 12 captures the same section of the security element 2 being transported past as a corresponding element 15 of the second sensor line 14. The magnetic signals of a respective pair of mutually corresponding elements 13, 15 deliver the first magnetic signal and second magnetic signal of a certain section of the security element 2.

During the detecting of the first magnetic signals, the security element 2 is not subjected to any magnetic field. The magnetosensitive elements 15 of the second sensor line 14 detect the second magnetic signals M2 of the security element 2 under the action of a second magnetic field B, which acts on the security element 2 before and during the detecting of the second magnetic signals. The second magnetic field B is made available by a permanent magnet 8 disposed on one side of the transport path S and has an extension such that it already magnetizes the security element 2 before the latter comes into the capture region of the second sensor line 14. The poles N, S of the magnet 8 are so aligned that there arises in the transport plane a magnetic field B anti-parallel to the transport direction T of the value document. The magnetic field strength of the magnetic field A amounts e.g. to at least twice the magnetic field strength of the magnetic field B.

The second magnetic field B is oriented anti-parallel to the transport direction T of the value document 1 and has a magnetic field strength lying between the coercive field strengths of the high-coercivity magnetic material and of the low-coercivity magnetic material of the security element 2. The second magnetic field B remagnetizes only the low-coercivity magnetic material, namely, in a second magnetization direction which is oriented anti-parallel to the first magnetization direction, i.e. anti-parallel to the transport direction T (−x direction). The magnetization of the high-coercivity magnetic material remains uninfluenced by the second magnetic field B and hence aligned in the first magnetization direction. Therefore, the magnetic field B changes only the magnetization of the low-coercivity magnetic region l and that of the combined magnetic region k. The magnetization of the low-coercivity magnetic region l is aligned anti-parallel to the first magnetization direction (−x direction) by the second magnetic field B. The magnetization of the combined magnetic region k results from the sum of the magnetizations of the high-coercivity portion and of the low-coercivity portion of the combined magnetic region k. When these two portions of the combined magnetic region have roughly the same remanent flux density, their magnetizations roughly cancel each other out. The magnetic field B hence causes the resultant magnetization of the combined magnetic region k to nearly vanish. Instead of the magnetic field directions from FIG. 1, it is equally possible to employ a magnetic field A anti-parallel to the transport direction and a magnetic field B parallel to the transport direction.

The detecting of the second magnetic signals M2 under the action of the second magnetic field B has the advantage that the second sensor line 14 can not only be employed for detecting the different magnetic regions h. l, k of the security element 2, but it can also detect magnetic signals of soft-magnetic magnetic regions w of the security element 2, and also soft-magnetic regions 11 which may be present on the value document outside the security element 2, cf. FIG. 1.

The sensor lines 12, 14 are disposed in direct proximity to the transport plane of the value document 1. It can be provided that the value documents 1 being transported past touch the surface of the sensor lines 12, 14, but there can also be provided a small distance between the surface of the sensor lines 12, 14 and the value document 1 being transported past, e.g. a distance in the mm range. The magnetosensitive elements 13, 15 are e.g. respectively disposed on a common printed board (wiring of printed boards not shown), and connected to an evaluation device 9 which evaluates the magnetic signals of the elements 13, 15.

The magnet for making available the second magnetic field can be e.g. a magnet disposed on one side of the transport path S, in whose symmetry plane the sensor line 14 is positioned. In FIG. 1a the magnet 8 is a horseshoe-shaped permanent magnet whose north pole and south pole face the value document being transported past. To produce the magnetic field B anti-parallel to the transport direction T of the value document, however, there can also be employed a plurality of magnets, e.g. two magnets 8 with a reverse arrangement of their magnetic poles, with the magnetic poles of the two magnets 8 facing away from the value document being connected e.g. by a yoke 7 made of magnetic steel, cf. FIG. 1b. Alternatively, there can also be employed a magnet 8 that faces the value document being transported past not with one of its magnetic poles, but with a side wall connecting the magnetic poles, cf. FIG. 1c. On the side wall the printed board of the sensor line 14 is fastened.

The printed board of the sensor line 14 of the magnetosensitive elements 15 and the magnet 8 are fixed mechanically to each other by potting so as to form one constructional unit. The evaluation device 9 receives magnetic signals from the two sensor lines 12, 14 and processes and analyzes them. The evaluation device 9 can e.g. be disposed together with the sensor lines 12, 14 in the same housing. Via an interface, data can be sent from the evaluation device 9 outside, e.g. to a device that processes the data further or to a display device that indicates the result of the value-document check.

FIG. 2a shows a further exemplary embodiment in a plan view of the transport plane (x-y). The security element 2 of the value document 1 is magnetized by the magnetic fields A, B in the above-described manner and transported past the two sensor lines 12, 14 which sense the first and second magnetic signals. As in FIG. 1, the first magnetic field A is, in this exemplary embodiment too, oriented parallel to the transport direction (x) of the value document and the second magnetic field B anti-parallel thereto (−x). The magnetosensitive elements 13, 15 of the first and second sensor lines 12, 14 have principal sensitivity directions H1 and H2 which are drawn into FIG. 2 by arrows on the respective magnetosensitive elements 13, 15. For example, the principal sensitivity directions H1, H2 of the magnetosensitive elements 13, 15 are oriented identically and parallel to the magnetic field A. The magnetosensitive elements 13 detect first magnetic signals M1 without the action of a magnetic field on the security element. The magnetosensitive elements 15 detect second magnetic signals M2 under the action of the second magnetic field B on the security element. The magnetic signals of the sensor lines 12, 14 are passed on to an evaluation device (not shown).

Figure 2B:
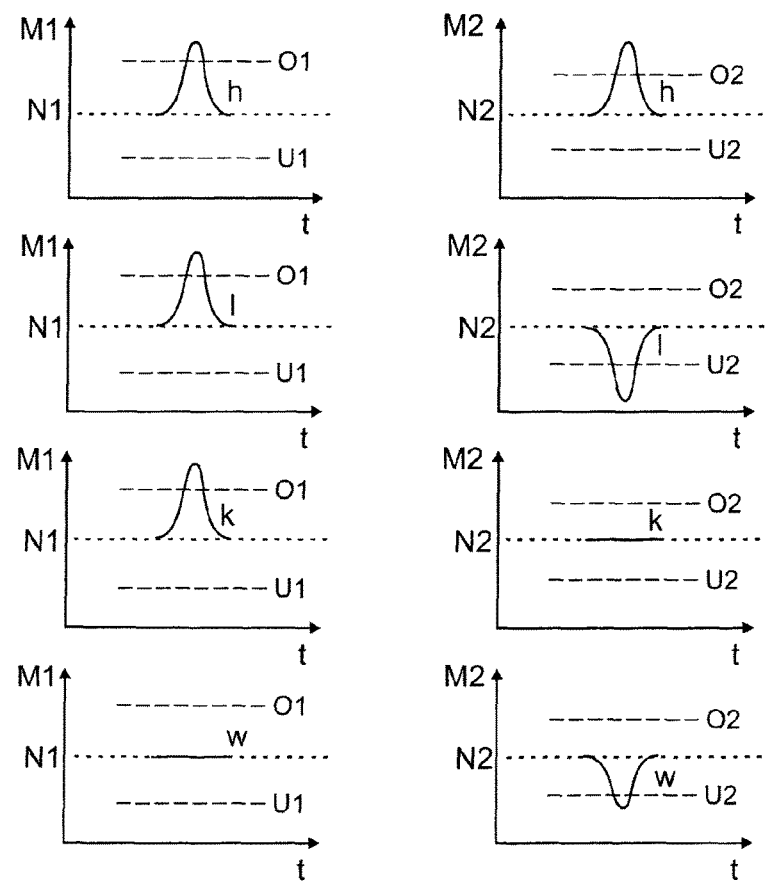

FIG. 2b represents the first and second magnetic signals M1, M2 of a high-coercivity magnetic region h (top diagram), of a low-coercivity magnetic region 1 (second diagram from the top), of a combined magnetic region k (third diagram from the top) and a soft-magnetic magnetic region w (bottom diagram) relative to the respective signal offset N1, N2. When the security element 2 is being transported past the sensor lines 12, 14, a high-coercivity magnetic region h produces the first magnetic signal M1, designated h, on a magnetosensitive element 13 of the first sensor line 12, and the second magnetic signal M2, designated h, on a corresponding magnetosensitive element 15 of the second sensor line 14. The two magnetic signals are roughly the same and exceed a first and second upper threshold O1, O2, respectively. The low-coercivity magnetic region 1 and the combined magnetic region k produce on a magnetosensitive element 13 of the first sensor line 12 a first magnetic signal M1, designated l or k, which roughly matches the first magnetic signal M1 of the high-coercivity magnetic region h. A magnetosensitive element 15 of the second sensor line 14 detects from the low-coercivity magnetic region the second magnetic signal M2, designated l, which undershoots the second lower threshold U2, cf. FIG. 2b, right. On the basis of the second magnetic signal M2 it is hence possible to distinguish high-coercivity and low-coercivity magnetic regions of the security element 2 unambiguously from each other.

A combined magnetic region k only produces a negligibly low second magnetic signal M2 on a magnetosensitive element 15 of the second sensor line, however, due to the anti-parallel alignment of its high-coercivity portion and low-coercivity portion, cf. FIG. 2b, right. The presence of a combined magnetic region k can thus be recognized by a clear first magnetic signal M1 being detected in a portion along the security element 2, but the second magnetic signal M2 in this portion being very low, not reaching e.g. either of the two first thresholds U1, O1. Thus, a combined magnetic region k can be unambiguously distinguished from the high- and low-coercivity magnetic regions of the security element.

The soft-magnetic magnetic region w of the security element only produces a vanishingly low first magnetic signal M1, in contrast to the other magnetic regions h, l, k. Since the second magnetic field B causes a magnetization of the soft-magnetic magnetic region w during the detecting of the second magnetic signals M2, however, said region produces on a magnetosensitive element 15 of the second sensor line 14 a clear second magnetic signal M2 which undershoots the second lower threshold U2, cf. FIG. 2b, bottom right.

FIG. 3a shows a further exemplary embodiment with anti-parallel magnetic fields A, B corresponding to FIG. 2a. The first magnetic detector and second magnetic detector each consist, in this example, of a sensor line 12, 14 whose magnetosensitive elements 13, 15 have principal sensitivity directions H1, H2 which are oriented perpendicular to the transport plane of the value document 1 (z direction). The magnetic signals of the sensor lines 12, 14 are passed on to an evaluation device (not shown) which processes the first and second magnetic signals further. In comparison to the example from FIG. 2a, different first and second magnetic signals M1, M2 also result, due to the changed principal sensitivity directions H1, H2, cf. FIG. 3b. The first magnetic signal and second magnetic signal of a high-coercivity magnetic region h both exceed the respective upper threshold O1, O2 and both undershoot the respective lower threshold U1, U2, cf. FIG. 3b, top. A low-coercivity magnetic region 1 likewise delivers first and second magnetic signals which both exceed upper thresholds O1, O2 and both undershoot lower thresholds U1, U2. While the first magnetic signals M1 of the high-coercivity magnetic region h and low-coercivity magnetic region 1 are roughly the same, the second magnetic signal M2 of the low-coercivity magnetic region 1 has a signal form inverse thereto, cf. FIG. 3b, right. The low-coercivity magnetic region 1 can hence be distinguished from the high-coercivity magnetic regions h by the signal form of its second magnetic signal M2.

A combined magnetic region k produces a first magnetic signal that is comparable to that of the high-coercivity magnetic region and of the low-coercivity magnetic region. Due to the anti-parallel alignment of its high-coercivity portion and low-coercivity portion, however, a combined magnetic region k again only produces a negligibly low second magnetic signal M2, cf. FIG. 3b, right. The presence of a combined magnetic region k can thus also be recognized in this example by a clear first magnetic signal M1 being detected in a section along the security element 2, but the second magnetic signal M2 in this section being very low, e.g. not reaching either of the two second thresholds U2, O2.

In this example, too, the soft-magnetic magnetic region w of the security element only produces a vanishingly low first magnetic signal M1, in contrast to the other magnetic regions h, l, k. Since the second magnetic field B causes a magnetization of the soft-magnetic magnetic region w during the detecting of the second magnetic signals M2, however, said region produces on a magnetosensitive element 15 of the second sensor line 14 a clear second magnetic signal M2 which exceeds the second upper threshold and undershoots the second lower threshold U2, cf. FIG. 3b, bottom right.

Figure 3C:
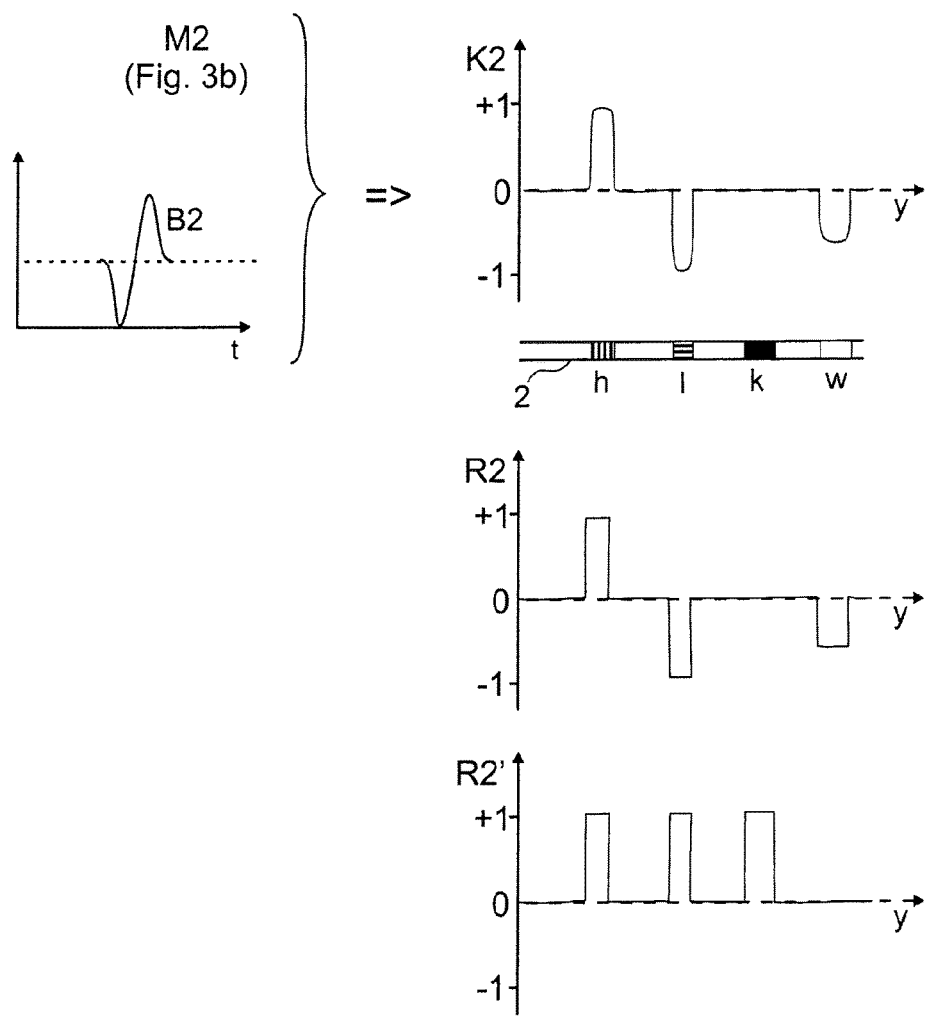

FIG. 3c makes clear an advantageous evaluation of the magnetic signals of the security element. For evaluating the first and second magnetic signals there is respectively employed a base signal B1, B2 dynamically produced from the first or second magnetic signal, which is characteristic of the first or second magnetic detector 12, 14. At each location of detection y along the security element 2, the magnetic signal M1, M2 detected at this location is correlated with the base signal B1, B2. FIG. 3c, top left, sketches by way of example a base signal B2 suitable for the magnetic signal M2 of the exemplary embodiment of FIGS. 3a, b. The correlation of the base signal B2 with the second magnetic signal M2 yields a correlation value K2, which is plotted as a function of the location of detection y in FIG. 3c, top right. As a correlation value K2 there is employed e.g. for each position y the maximum of the correlation of the base signal B2 with the second magnetic signal M2. The locations of detection along the y direction are so close here that a plurality of correlation values K2 can be calculated individually for each of the magnetic regions h, l, k, w. The correlation values K2(y) reflect the arrangement of the magnetic regions h, l, k, w along the security element 2. Due to the great similarity of the form and height of the second magnetic signals M2 of the high-coercivity magnetic region h with the base signal B2, its correlation values K2 lie approximately at +1. The correlation values K2 of the low-coercivity magnetic region l, however, lie approximately at −1, since its second magnetic signal M2 is configured inversely to the base signal B2, cf. FIG. 3b. The correlation values K2 of the soft-magnetic magnetic region w reach a negative value above −1, due to the lower magnetic signal amplitude of the second magnetic signal M2, cf. FIG. 3b. For the combined magnetic region k there result near-vanishing correlation values K2, due to the vanishingly low second magnetic signal M2. In the evaluation there are employed the correlation values K2(y) derived from the second magnetic signal M2, as a function of the longitudinal direction y of the security element 2. Analogously, first correlation values K1(y) are formed (not shown) from the first magnetic signal M1 by correlation with a first base signal B1 which can be configured similarly or identically to B2.

The correlation values K1(y) and K2(y) of the first magnetic signal and second magnetic signal, respectively, can be compared—analogously to the first magnetic signal and second magnetic signal themselves—with a respective upper threshold O1, O2 and a lower threshold U1, U2. Alternatively to a comparison of the correlation values with thresholds, however, the correlation values can also be correlated, by calculation of a further correlation, with at least one predetermined reference pattern as a function of the longitudinal direction y of the security element. The result of this further correlation can be employed for checking the security element, e.g. for an authenticity check. For example, each sort of a security element has associated therewith a reference pattern R1(y) with for the correlation values K1(y) of the first magnetic signal M1 and a reference pattern R2(y) for the correlation values K2(y) of the second magnetic signal M2. In particular, different reference patterns R1(y), R2(y), R1'(y), R2'(y), etc., can be predetermined for different kinds of value document.

FIG. 3c shows the reference pattern R2(y) for the second magnetic signal M2 of the security element 2 sketched in FIG. 3c. At a very good match of the pattern of the correlation values K2(y) with the reference pattern R2(y) predetermined for the security element 2, the further correlation delivers a numerical value of +1. The pattern of the correlation values K2(y) roughly matches the reference pattern R2'(y) holding for a different security element, in contrast, only in the region of the high-coercivity magnetic region h, while the reference pattern R2'(y) is completely different in the section of the magnetic regions l, k, w. The further correlation for the reference pattern R2'(y) hence yields a very low numerical value of just over 0, but far lower than +1. If the correlation values K2(y) of the security element 2 were checked for a match with the reference pattern R2(y), it would pass this check. The security element would not pass a check for a match with the reference pattern R2'(y), in contrast. For checking the security element, the result of the further correlation which is carried out for the first correlation values K1(y) and/or for the second correlation values K2(y) can e.g. be respectively compared with a minimum value.

Figure 4A:
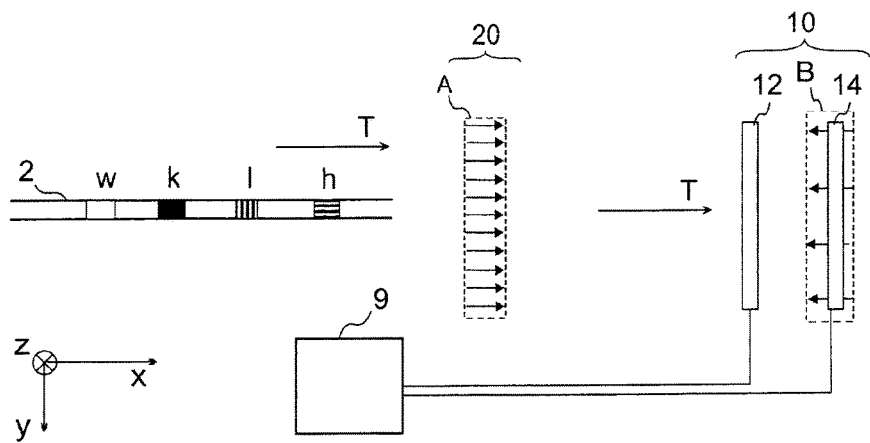

FIG. 4a sketches a further exemplary embodiment of an apparatus for checking a value document 1 wherein a value document (not shown) containing a security element 2 is transported past the apparatus along a transport direction T. The apparatus is configured for checking a security element 2 whose longitudinal direction extends parallel to the transport direction T of the value document. The apparatus has an assembly comprising a magnetization device 20 which makes available a first magnetic field A parallel to the transport direction T of the value document. The apparatus moreover contains a first magnetic detector 12 and a second magnetic detector 14 which are both disposed after the magnetization device 20, regarded in the transport direction T. The two magnetic detectors 12, 14 are oriented perpendicular to the longitudinal direction of the security element 2 and respectively possess only a single magnetosensitive element, which is configured at least for detecting magnetic fields parallel and anti-parallel to the transport direction T. As in the previous exemplary embodiments, the first magnetic detector 12 detects first magnetic signals M1 without the action of a magnetic field, and the second magnetic detector 14 detects second magnetic signals M2 under the action of a second magnetic field B which is oriented anti-parallel to the first magnetic field A. The apparatus moreover has an evaluation device 9 which is connected to the first and second magnetic detectors 12, 14. In contrast to the preceding examples, the first magnetic signals M1 as well as the second magnetic signals M2 of the different magnetic regions h, I, k, w of the security element 2 are respectively detected in temporal succession in this example. Depending on the sensitivity direction of the magnetic detectors 12, 4, this can yield first and second magnetic signals which are comparable to those of FIGS. 2*b*, 3*b* and can be evaluated analogously.

Figure 4B:
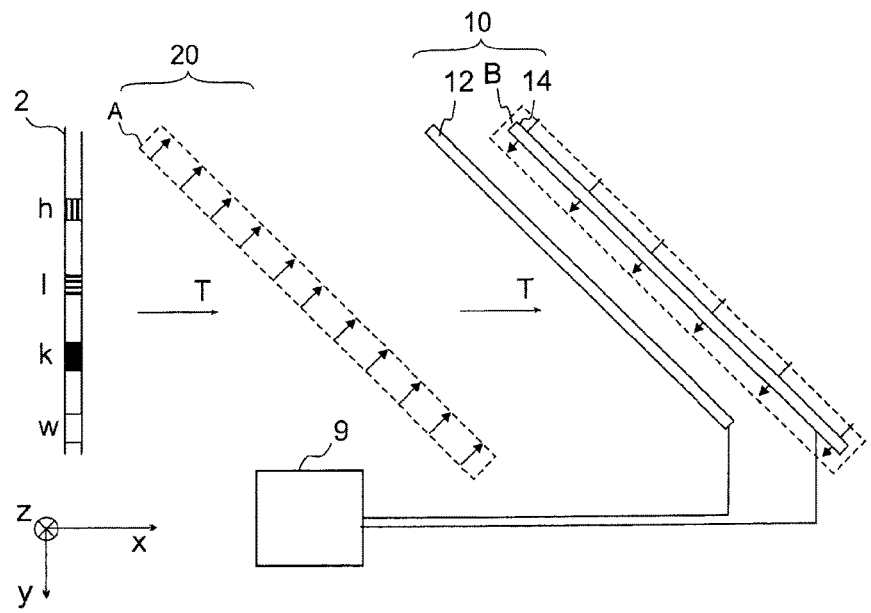

FIG. 4*b* shows a further exemplary embodiment which largely corresponds to the exemplary embodiment of FIG. 4*a*. In contrast, in this exemplary embodiment the magnetization device 20 for detecting the first magnetic field A and the magnetization device for detecting the second magnetic field (not shown) as well as the magnetic detectors 12, 14 are oriented obliquely to the transport direction T of the security element 2. Due to the oblique position, a spatially resolved detection of the security element can be obtained even without the use of elaborate sensor lines. The two magnetosensitive elements of the magnetic detectors 12, 14 detect the first magnetic signals and the second magnetic signals of the different magnetic regions h, l, k, w respectively in temporal succession, analogously to the example of FIG. 4*a*. The evaluation can likewise be effected as described hereinabove.

The invention claimed is:

1. A method for checking a value document which has a security element having a plurality of magnetic regions, the plurality of magnetic regions of the security element comprising a high-coercivity magnetic region which contains a high-coercivity magnetic material having a first coercive field strength, a low-coercivity magnetic region which contains a low-coercivity magnetic material having a second coercive field strength which is lower than the first coercive field strength, and a combined magnetic region which contains the high-coercivity as well as the low-coercivity magnetic material, wherein in the method the following steps are carried out by a checking apparatus as the value document is moved through the checking apparatus:
    effecting first magnetizing of the security element by a first magnetic field whose magnetic field strength is greater than the first coercive field strength, so that magnetization of the high-coercivity magnetic material and magnetization of the low-coercivity magnetic material are aligned in a first magnetization direction; and thereafter
    detecting first magnetic signals of the security element by a first magnetic detector; and thereafter
    effecting second magnetizing of the security element by a second magnetic field whose magnetic field strength is smaller than the first coercive field strength, but is greater than the second coercive field strength, the second magnetic field being so oriented that magnetization of the low-coercivity magnetic material becomes aligned parallel, but in the opposite direction, to the first magnetization direction by the second magnetizing, and detecting second magnetic signals of the security element by a second magnetic detector, the second magnetic signals of the security element being detected under the action of the second magnetic field;
    wherein the first magnetizing is performed in a first location spatially separate from the first magnetic detector, the second magnetic detector, and from a second location where the second magnetizing is performed,
    and the second magnetic detector is configured as a sensor line having a multiplicity of magnetosensitive elements fastened on a common carrier which is mechanically fixed to a second magnetization device so as to form one constructional unit located in the second location where the second magnetizing is performed.

2. The method according to claim 1, wherein the at least one combined magnetic region is so magnetized by the second magnetic field that a resultant magnetization of the at least one combined magnetic region, which arises through the second magnetizing, vanishes at least approximately.

3. The method according to claim 1, wherein there are also detected by the second magnetic detector second magnetic signals of one or more soft-magnetic regions of the value document.

4. The method according to claim 1, wherein the high-coercivity as well as the low-coercivity magnetic material of the security element is magnetized in the first magnetization direction immediately before and during the detecting of the first magnetic signals of the respective magnetic region.

5. The method according to claim 1, wherein there is carried out an evaluation of the magnetic signals of the security element wherein
    for a plurality of magnetic regions of the security element there is respectively employed individually at least one correlation value derived from the first magnetic signal of the respective magnetic region, said value being formed by a correlation of the respective first magnetic signal with a first base signal which is characteristic of the first magnetic detector; and/or
    for a plurality of magnetic regions of the security element there is respectively employed individually at least one correlation value derived from the second magnetic signal of the respective magnetic region, said value being formed by a correlation of the respective second magnetic signal with a second base signal which is characteristic of the second magnetic detector.

6. The method according to claim 5, wherein the first and/or the second base signal is chosen in dependence on the properties of the security element or of the respective magnetic region, in dependence on the extension of the security element or of the respective magnetic region along a transport direction of the value document.

7. The method according to claim 5, wherein the first base signal is dynamically established from the first magnetic signal, and/or the second base signal from the second magnetic signal, of one or more magnetic regions of the security element, the first and/or the second base signal being established individually for each security element.

8. The method according to claim 5, wherein there is carried out an evaluation wherein
    the correlation values derived from the first magnetic signal, as a function of the longitudinal direction of the security element, are correlated with at least one predetermined reference pattern as a function of the longitudinal direction of the security element, and the result of this further correlation is employed for checking the security element; and/or
    the correlation values derived from the second magnetic signal, as a function of the longitudinal direction of the security element, are correlated with at least one predetermined reference pattern as a function of the longitudinal direction of the security element, and the result of this further correlation is employed for checking the security element.

9. The method according to claim 5, wherein a magnetic region whose first magnetic signal or correlation values derived therefrom, exceed a first upper threshold and/or undershoot a first lower threshold, and whose second magnetic signal or correlation values derived therefrom, neither exceed a second upper threshold nor undershoot a second lower threshold, is identified as a combined magnetic region.

10. The method according to claim 5, wherein a magnetic region whose first magnetic signal or correlation values derived therefrom, neither exceed a first upper threshold nor undershoot a first lower threshold, and whose second magnetic signal or correlation values derived therefrom, exceed a second upper threshold and/or undershoot a second lower threshold, is identified as a soft-magnetic magnetic region by at least one of the detectors.

11. An apparatus for checking a value document having a security element with a plurality of magnetic regions comprising a high-coercivity magnetic region containing high-coercivity magnetic material of a first coercive field strength and a low-coercivity magnetic region containing low-coercivity magnetic material of a second coercive field strength, the apparatus comprising one after the other along a transport direction of the value document:
- a first magnetization device for making available a first magnetic field which is configured for effecting first magnetizing of the high-coercivity and of the low-coercivity magnetic material in a first magnetization direction, the magnetic field strength employed for the first magnetizing being greater than the first coercive field strength; and thereafter
- a first magnetic detector for detecting first magnetic signals of the security element; and thereafter
- a second magnetization device for making available a second magnetic field which is configured for effecting second magnetizing of the low-coercivity magnetic material in a second magnetization direction which is oriented parallel, but in the opposite direction, to the first magnetization direction, the magnetic field strength employed for the second magnetizing being smaller than the first coercive field strength, but being greater than the second coercive field strength; and
- a second magnetic detector for detecting second magnetic signals of the security element, the second magnetic detector being configured such that the second magnetic signals of the security element are detected under the action of the second magnetic field,
- wherein the second magnetic detector is configured as a sensor line having a multiplicity of magnetosensitive elements fastened on a common carrier which is mechanically fixed to the second magnetization device so as to form one constructional unit, and
- the first magnetization device is disposed spatially separate from the first magnetic detector, the second magnetic detector, and from the second magnetization device along the transport path of the value document.

12. The apparatus according to claim 11, wherein the second magnetization device has one or more magnets disposed on one side of the transport path of the value document, being disposed on that side of the transport path on which the second magnetic detector is also disposed.

13. The apparatus according to claim 12, wherein the at least one magnet of the second magnetization device and the second magnetic detector are mechanically fixed to each other so as to form one constructional unit.

14. The apparatus according to claim 12, wherein the second magnetic detector is disposed on top of the at least one magnet such that the distance between a top surface of the at least one magnet and the magnetosensitive elements of the second magnetic detector, along the direction perpendicular to the transport plane of the value document, amounts to at most 4 mm.

15. The apparatus according to claim 11, wherein the first magnetization direction is oriented parallel or anti-parallel to the transport direction of the value document.

16. An apparatus for checking a value document having a security element with a plurality of magnetic regions comprising a high-coercivity magnetic region containing high-coercivity magnetic material of a first coercive field strength and a low-coercivity magnetic region containing low-coercivity magnetic material of a second coercive field strength, the apparatus comprising one after the other along a transport direction of the value document:
- a first magnetization device for making available a first magnetic field which is configured for effecting first magnetizing of the high-coercivity and of the low-coercivity magnetic material in a first magnetization direction, the magnetic field strength employed for the first magnetizing being greater than the first coercive field strength; and thereafter
- a first magnetic detector for detecting first magnetic signals of the security element; and thereafter
- a second magnetization device for making available a second magnetic field which is configured for effecting second magnetizing of the low-coercivity magnetic material in a second magnetization direction which is oriented parallel, but in the opposite direction, to the first magnetization direction, the magnetic field strength employed for the second magnetizing being smaller than the first coercive field strength, but being greater than the second coercive field strength; and
- a second magnetic detector for detecting second magnetic signals of the security element, the second magnetic detector being configured such that the second magnetic signals of the security element are detected under the action of the second magnetic field after the low-coercivity magnetic material has been aligned parallel but in the opposite direction to the first magnetization direction; and
- wherein the second magnetic detector is disposed on top of at least one magnet such that the distance between a top surface of the at least one magnet and magnetosensitive elements of the second magnetic detector, along the direction perpendicular to the transport plane of the value document, amounts to at most 4 mm.

* * * * *